United States Patent [19]

Sakaue

[11] Patent Number: 5,266,845
[45] Date of Patent: Nov. 30, 1993

[54] SEMICONDUCTOR INTEGRATED CIRCUIT PROVIDED WITH EMITTER COUPLED LOGIC INPUT/OUTPUT BUFFERS

[75] Inventor: Kenji Sakaue, Yokohama, Japan

[73] Assignee: Kabushiki Kaisha Toshiba, Kawasaki, Japan

[21] Appl. No.: 782,486

[22] Filed: Oct. 25, 1991

[30] Foreign Application Priority Data

Oct. 26, 1990 [JP] Japan .................. 2-290460

[51] Int. Cl.⁵ .......................... H03K 17/16
[52] U.S. Cl. ................. 307/443; 307/296.3; 307/467
[58] Field of Search ............ 307/475, 465.1, 466, 307/467, 443, 303, 303.1, 296.3

[56] References Cited

U.S. PATENT DOCUMENTS

| | | | |
|---|---|---|---|
| 4,656,370 | 4/1987 | Kanuma | 307/465.1 |
| 4,691,123 | 9/1987 | Hashimoto | 307/296.3 |
| 4,801,820 | 1/1989 | Nootbaar | 307/303 |
| 4,882,506 | 11/1989 | Johansson et al. | 307/296.1 |
| 4,950,921 | 8/1990 | Takada | 207/296.1 |
| 5,121,036 | 6/1992 | Fuji | 307/303 |

FOREIGN PATENT DOCUMENTS 60-148135  8/1985  Japan .

OTHER PUBLICATIONS

Shookhtim et al., "Novel Boundary Scan Circuit and Methodology For ECL/BiCMOS VLSI," IEEE 1990 Bipolar Circuits and Technology Meeting, 6.2, pp. 128-131 (1990).

Primary Examiner—Edward P. Westin
Assistant Examiner—Andrew Sanders
Attorney, Agent, or Firm—Foley & Lardner

[57] ABSTRACT

A semiconductor integrated circuit comprises an Emitter Coupled Logic (ECL) input buffer and an ECL output buffer which are driven by m (m is equal to 2 or more) power supplies, a test ECL input buffers and a test ECL output buffers which are driven by m power supplies, and four first to fourth drive voltage supply lines for delivering drive voltages to the four input and output buffers. This semiconductor integrated circuit is characterized in that one of the m number of third drive voltage supply lines and a corresponding one of the m number of first drive voltage supply lines are commonly connected, or the third drive voltage supply lines are provided independently of the first drive voltage supply lines, and that one of m number of fourth drive voltage supply lines and a corresponding one of the m number of second drive voltage supply lines are commonly connected, or the fourth drive voltage supply lines are provided independently of the second drive voltage supply lines, whereby when the semiconductor integrated circuit is in an ordinary use state after being assembled into the system, the same voltages are delivered to the m number of third drive voltage supply lines and the m number of fourth drive voltage voltages supply lines, respectively.

8 Claims, 4 Drawing Sheets

SEMICONDUCTOR INTEGRATED CIRCUIT PROVIDED WITH EMITTER COUPLED LOGIC INPUT/OUTPUT BUFFERS

BACKGROUND OF THE INVENTION

This invention relates to a semiconductor integrated circuit provided with Emitter Coupled Logic (hereinafter referred to as ECL) input/output buffers, and more particularly to a semiconductor integrated circuit provided with ECL input/output buffers capable of reducing power consumption.

Generally, in the case of inputting an input signal of the ECL level from the external to the device such as SRAM or CPU, etc., and outputting an output signal of the ECL level from the above-mentioned device to the external, an ECL input buffer and an ECL output buffer are used, respectively.

Such ECL input buffer and ECL output buffer are shown in FIGS. 1 and 2, respectively. The ECL input buffer shown in FIG. 1 serves to convert an input signal of the ECL level to an output signal of the CMOS level. This ECL input buffer comprises a CMOS circuit comprised of diodes 3a and 3b, a resistor 3c, transistors 4a, 4b, 4c, 5a, 5b and 5c, a transistor 6a, resistors 6b and 6c, and transistors 7a and 7b, and a CMOS circuit comprised of transistors 8a and 8b, and is driven by a first power supply (e.g., power supply of 0 volts) connected to the terminal 1, and a second power supply (e.g., power supply of −5.0 volts) connected to the terminal 2.

On the other hand, the ECL output buffer shown in FIG. 2 serves to convert an input signal of the CMOS level to an output signal of the ECL level. This ECL output buffer comprises transistors 13a, 13b and 13d, resistors 13c and 15a, transistors 14a, 14b, 15b and 16a, a resistor 16b, and diodes 17a and 17b, and is driven by a first power supply connected to the terminal 11 and a second power supply connected to the terminal 12. In addition to the input/output buffer of the above-mentioned type, there is a known ECL input/output buffer of the type that receives an input signal of the ECL level to output an output signal of the ECL level. Further, there is also known an ECL input/output buffer of the type driven by m ($\geq 2$) number of power supplies.

A conventional semiconductor integrated circuit including such an ECL input/output buffer is shown in FIG. 3. This semiconductor integrated circuit is provided on a Large Scale Integrated circuit (LSI) chip 20. This semiconductor integrated circuit comprises ECL input buffers $21_1$, $21_n$ used when the circuit is in an ordinary operating state after assembly into the system, ECL output buffers $22_1$, ... $22_n$ is used when the circuit is similarly in the ordinary operating state after assembled into the system, test ECL input buffer $23_1$, ... $23_n$ used only when the circuit is assembled into the system and is subject to testing, and test ECL output buffers $24_1$, ... $24_n$ are used only when the circuit is assembled into the system and is similarly subject to testing. In operation, the input buffer $21_i$ ($i=1, ...n$) is driven by a first power supply voltage delivered through a power supply pad 25a and a second power supply voltage delivered through a power supply pad 25b to apply level conversion or waveform shaping to an input signal of the ECL level inputted through a pad $26_i$ ($i=1, ...n$) when the circuit is in an ordinary operating state after being assembled to send it to an device (e.g., CPU, etc.) 27 provided at the core section. Further, the output buffer $22_i$ ($i=1, ... n$) is driven by a first power supply voltage delivered through a power supply pad 28a and a second power supply voltage delivered through a power supply pad 28b to apply level conversion to a signal sent from the device when the circuit is in the operating state after assembly to provide an output signal of the ECL level to output it to the external through a power supply pad $29_i$.

On the other hand, the test input buffer $23_i$ ($i=1, ... n$) is driven by a first power supply voltage delivered through a power supply pad 30a and a second power supply voltage delivered through a power supply pad 30b to apply level conversion or waveform shaping to an input signal of the ECL level inputted through a power supply pad $31_i$ ($i=1, ... n$) to send it to the device 27. Further, a test output buffer $24_i$ ($i=1, ... n$) is driven by a first power supply voltage delivered through a power supply pad 32a and a second power supply voltage delivered through a power supply pad 32b to apply level conversion to a signal outputted from the device 27 when the circuit is subject to test to provide an output signal of the ECL level to output it to the external through a power supply pad $33_i$ ($i-1, ...n$). Respective terminals to which the first power supply voltages are applied of the input buffers $21_1, ... 21_n$, the output buffers $22_1, ... 22_n$, the test input buffers $23_1, ... 23_n$, and the test output buffers $24_1, ... 24_n$ are connected commonly to a power supply line 34a, and respective terminals to which the second power supply voltages are applied of the above mentioned buffers are connected commonly to a power supply line 34b.

As seen from FIGS. 1 and 2, the ECL input/output buffer is of a structure in which a current flows therein as long as any drive voltage is applied thereto. Accordingly, in the conventional semiconductor integrated circuit provided with the test ECL input/output buffers, there was the problem that even after such a semiconductor integrated circuit is assembled into the system, current flows in the test ECL input/output buffers, so power is uselessly consumed.

SUMMARY OF THE INVENTION

This invention has been made in view of the above-mentioned problems, and its object is to provide a semiconductor integrated circuit permitting a power consumption to be as small as possible.

An object of the present invention is to resolve the problem which occurs when a Very Large Scale Interated Circuit (VLSI) having ECL interfaces is made with Bi-CMOS devices. For example, in a VLSI such as a microprocessor having 32 bits, it is necessary to provide a plurality of input and output buffers (pins) in order to estimate a Large Scale Integrated Circuit (LSI) manufactured by a logic tester. However, since there is a large amount of power consumption per ECL input or output buffer, the numbers of input and output buffers are limited by the power consumption of the chip. Thus, it is impossible to provide a sufficient number of input and output buffers exclusively for a test function which as no direct relation to an original function of the LSI.

A semiconductor integrated circuit according to this invention comprises an ECL input buffer and an ECL output buffer which are driven by m ($\geq 2$) number of power supplies, a test ECL input buffer and a test ECL output buffer which are driven by m number of power supplies, m number of first drive voltage supply lines for delivering a drive voltage to the ECL input buffer, m number of second drive voltage supply lines for delivering a drive voltage to the ECL output buffer, m number of third drive voltage supply lines for delivering a drive voltage to the test ECL input buffer, and m number of fourth drive voltage supply lines for delivering a drive voltage to the test ECL output buffer, wherein one of the m number of third drive voltage supply lines and a corresponding one of the m number of first drive voltage supply lines are commonly connected, or the third drive voltage supply lines are provided independently of the first drive voltage supply lines, and wherein one of m number of fourth drive voltage supply lines and a corresponding one of the m number of second drive voltage supply lines are commonly connected, or the fourth drive voltage supply lines are provided independently of the second drive voltage supply lines, whereby when the semiconductor integrated circuit is in an ordinary use state after assembled into the system, the same voltages are delivered to the m number of third drive voltage supply lines and the m number of fourth drive voltage supply lines, respectively.

In accordance with the semiconductor integrated circuit of this invention thus constructed, only when the circuit is assembled into the system and is subject to test, the test ECL input buffer and the test ECL output buffer are driven by normal power supply voltages. Further, when the circuit is in an ordinary use state after assembled into the system, m number of drive voltages for driving the test ECL input/output buffers are equal to each other. Accordingly, no current flows in the test ECL input buffer and the test ECL output buffer. As a result, power can be prevented from uselessly being consumed to a greater degree as compared to the conventional semiconductor integrated circuit. Thus, power consumption can be small.

In accordance with this invention, an increase in the power consumption can be prevented to a large degree.

BRIEF DESCRIPTION OF THE DRAWINGS

In the accompanying drawings.

DETAILED DESCRIPTION OF THE PREFERRED EMBODIMENTS

Preferred embodiments of a semiconductor integrated circuit provided with input/output buffers according to this invention will now be described with reference to the attached drawings.

Figure 4:
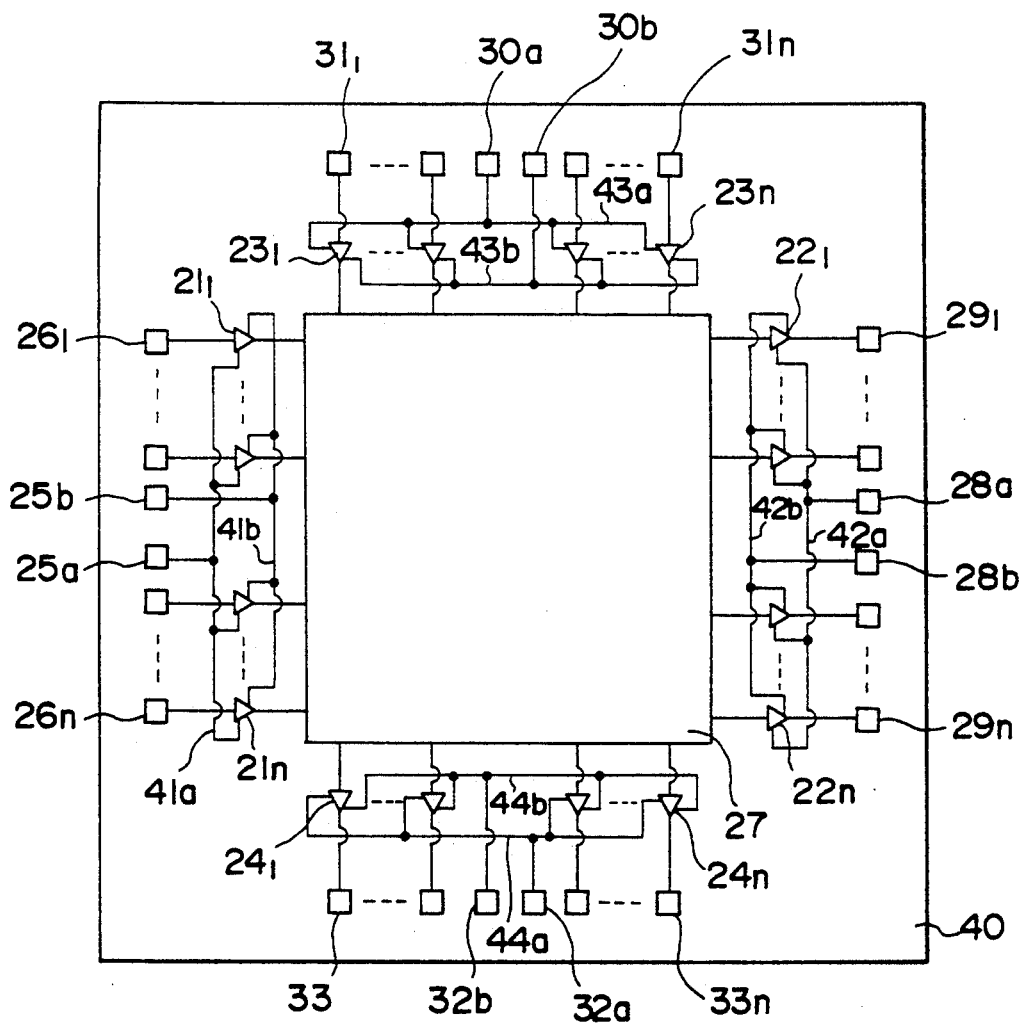
FIG. 4 is a circuit diagram showing the outline of the configuration of a semiconductor integrated circuit provided with input/output buffers according to a first embodiment of this invention.

A first embodiment of a semiconductor integrated circuit according to this invention is shown in FIG. 4. The semiconductor integrated circuit of this embodiment is provided on a LSI chip 40. This semiconductor integrated circuit comprises ECL input buffers $21_l$, ... $21_n$ used when the circuit is in an ordinary operating state after assembly into the system, ECL output buffers $22_l$, ... $22_n$ used when the circuit is similarly in in the ordinary operating state after being assembled into the system, test ECL input buffers $23_l$, ... $23_n$ are used only when the circuit is assembled into the system and the system is subject to test, and test ECL output buffers $24_l$, ... $24_n$ are used only when the circuit is assembled into the system and is similarly subject to testing.

Circuit differs from the conventional semiconductor integrated circuit in that drive voltage supply lines through which drive voltages for driving the ECL input buffers $21_l$, ... $21_n$, the ECL output buffers $22_l$, ... $22_n$, the test input ECL buffers $23_l$, ... $23_n$, and the test ECL output buffers $24_l$, ... $24_n$ are delivered are separately provided on the LSI chip 40, respectively. Namely, first and second drive voltages for driving the ECL input buffers $21_l$, $21_n$ are delivered to the ECL input buffers $21_l$, ... $21_n$ respectively through a power supply pad 25a and a drive voltage supply line 41a, and a power supply pad 25b and a drive voltage supply line 41b to drive the ECL output buffers $22_l$, $22_n$. Further, first and second drive voltages are delivered to the ECL output buffers $22_l$, ... $22_n$, respectively, through a power supply pad 28a and a drive voltage supply line 42a, and a power supply pad 28b and a drive voltage supply line 42b. On the other hand, two drive voltages for driving the test ECL input buffers $23_l$, ... $23_n$ are delivered to the test ECL input buffers $23_l$, ... $23_n$ respectively through a power supply pad 30a and a drive voltage supply line 43a, and a power supply pad 30b and a drive voltage supply line 43b, and two drive voltages for driving the test ECL output buffers $24_l$, ... $24_n$, are delivered to the test ECL output buffers $24_l$, ... $24_n$, respectively, through a power supply pad 32a and a drive voltage supply line 44a, and a power supply pad 32b and a drive voltage supply line 44b. In addition, these respective drive voltage supply lines 41a, 41b, 42a, 42b, 43a, 43b, 44a and 44b are separately provided on the LSI chip 40.

In the semiconductor integrated circuit of the first embodiment, wire bonding is implemented such that only when this semiconductor integrated circuit is assembled into the system and is subject to test, the first drive voltage is delivered to the power supply pads 30a and 32a, and the second drive voltage is delivered to the power supply pads 30b and 32b, and when this semiconductor integrated circuit is in an ordinary use state after being assembled into the system, the first drive voltage is delivered to the power supply pads 25a and 28a, and the second drive voltage is delivered to the power supply pads 25b, 28b, 30a, 30b, 32a and 32b. By implementing wire bonding in this way, when the semiconductor integrated circuit is in an operating state except for test state (after it is assembled), two voltages for driving the test ECL input buffers $23_l$, ... $23_n$ and the test ECL output buffers $24_l$, $24_n$ are equal to each other. As a result, no current flows in the test ECL input buffers $23_l$, $23_n$ and the ECL output buffers $24_l$, $24_n$. Thus, power uselessly consumed can be reduced. It is to be noted that, in the above-described embodiment, pads $31_l$, $31_n$ and pads $33_l$, ... $33_n$ are not subject to Wire boding with respect to the external pads, i.e., the pads $31_l$, ... $31_n$ are placed in floating state and the pads $33_l$, ... $33_n$ are placed in an open state.

Figure 5:
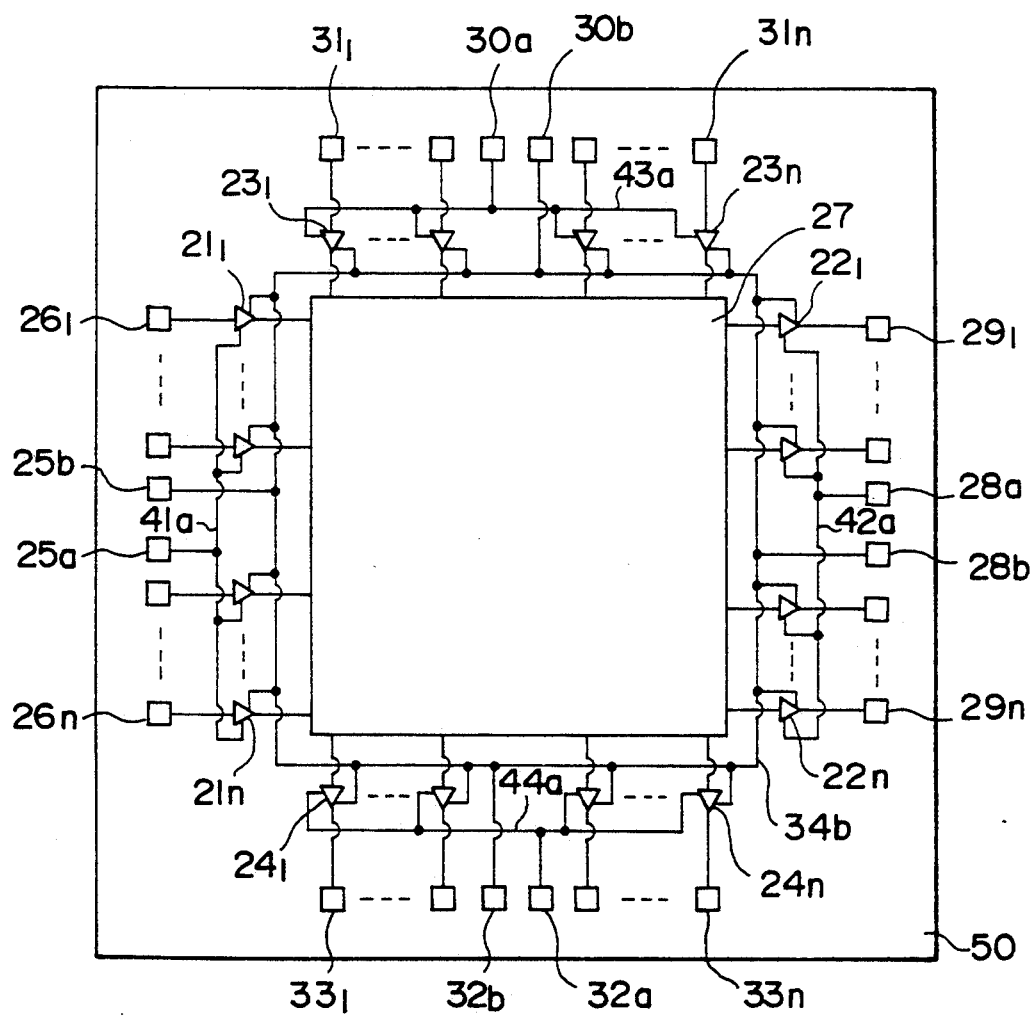
FIG. 5 is a circuit diagram showing the outline of the configuration of a semiconductor integrated circuit provided with input/output buffers according to a second embodiment of this invention.

A second embodiment of a semiconductor integrated circuit according to this invention is shown in FIG. 5.

Figure 1:
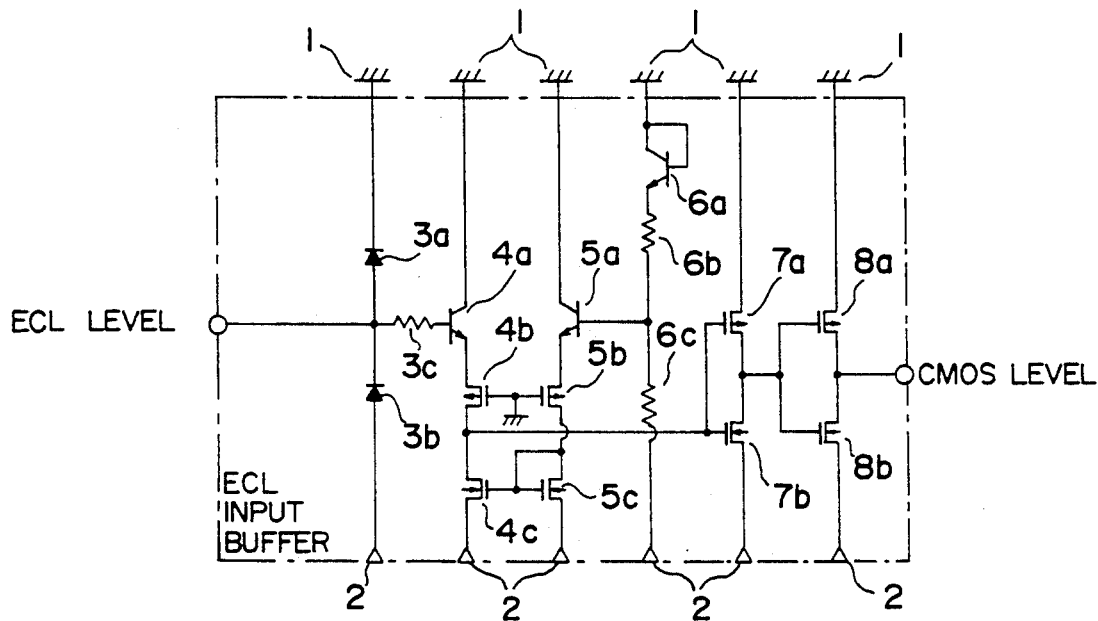
FIG. 1 is a circuit diagram showing the configuration of an input buffer provided in semiconductor integrated circuits according to the prior art and this invention.
Figure 2:
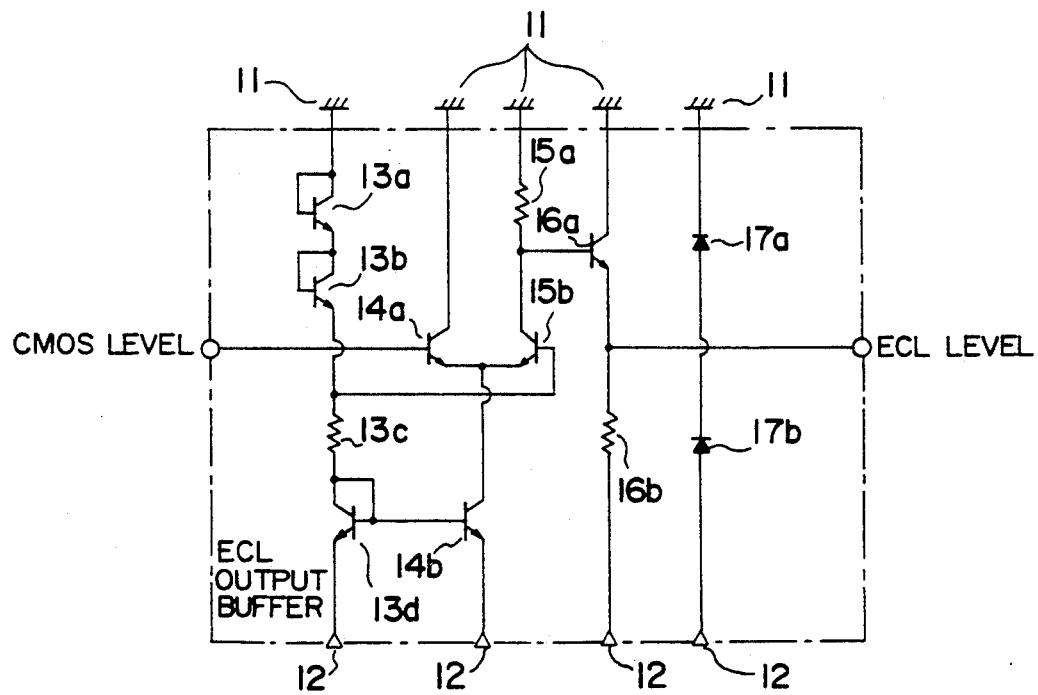
FIG. 2 is a circuit diagram showing the configuration of an output buffer provided in semiconductor integrated circuits according to the prior art and this invention.
Figure 3:
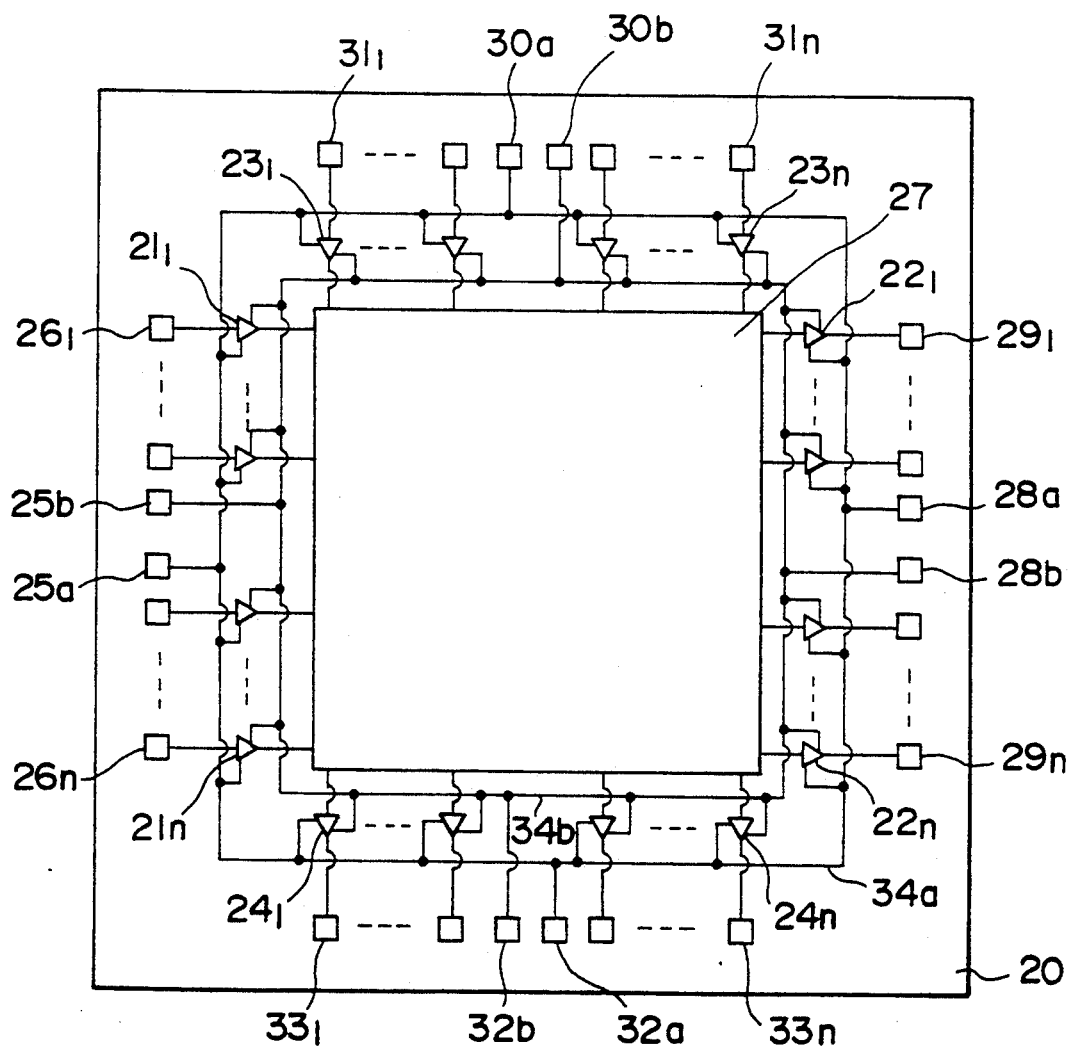
FIG. 3 is a circuit diagram showing the outline of the configuration of a conventional semiconductor integrated circuit provided with input/output buffers.

The semiconductor integrated circuit of this embodiment is featured below. Namely, in the conventional semiconductor integrated circuit shown in FIG. 3, the first power supply voltage supply line 34a for delivering the first power supply voltage to the ordinary ECL input buffer 21i (i=1, ... n), the ordinary ECL output buffer 22i (i=1, ... n), the test ECL input buffer 23i (i=1, ... n) and the test ECL output buffer 24i (i=1, ... n) is separated on the chip 50 to provide first supply lines 41a, 42a, 43a and 44a. Accordingly, there is employed in this embodiment an arrangement such that these first supply lines 41a, 42a, 43a and 44a respectively correspond to those of the first embodiment, and the second supply line 34b corresponds to that of the prior art shown in FIG. 3. At the time of testing this semiconductor integrated circuit, the first drive voltage is applied to the power supply pads 30a and 32a, and the second drive voltage is applied to the power supply pads 30b and 32b, so respective voltages are delivered through the voltage supply lines 43a and 34b. As a result, the test ECL input buffer 23i (i=1, ... n) and the test ECL output buffer 24i (i=1, ... n) become operative. Thus, a signal of the ECL level provided through the pad 31i from the external is sent to the device 27 (e.g., CPU, etc.) provided on the core section through the ECL input buffer 23i. Further, a signal from the above-mentioned device 27 is converted to a signal of the ECL level by the ECL output buffer 24i through the supply lines 34b and 44a, and is then outputted to the external through the pad 33i. Thus, test of the semiconductor integrated circuit is carried out.

Furthermore, wire bonding is implemented such that when this semiconductor integrated circuit is in an ordinary use state after assembly into the system, the first power supply voltage is applied to the power supply pads 25a and 28a, and the second power supply voltage is applied to the power supply pads 25b, 28b, 30a, 30b, 32a and 32b. By implementing wire bonding in this way, after the semiconductor integrated circuit is assembled into the system, the drive voltage is delivered through the first supply lines 41a and 42a and and the second supply line 34b. Accordingly, no current flows in the test ECL input buffer 23i (i=1, ... n) and the test ECL output buffer 24i (i=1, ... n). As a result, the power uselessly consumed can be reduced. Thus, an increase in the power can be prevented to a greater degree, as compared to the conventional semiconductor integrated circuit.

It is to be noted that while it has been described in both the above-described embodiments that the number of drive power supplies for the ordinary input/output buffers and the test input/output buffers is equal to 2, in the case where the number of drive power supplies is m (≧2), an approach described below may be employed:
a) to connect one of m number of test drive voltage supply lines for delivering drive voltages to test ECL input buffers commonly to a corresponding one of m number of ordinary drive voltage supply lines for delivering drive voltages to the ordinary ECL input buffers, or to provide test drive voltage supply lines independently of the ordinary drive voltage supply lines, and b) to connect one of m number of test drive voltage supply lines for delivering drive voltages to test ECL output buffers commonly to a corresponding one of m number of ordinary drive voltage supply lines for delivering drive voltages to the ordinary ECL output buffers, or to provide test drive voltage supply lines independently of the normal drive voltage supply lines. In addition, when the semiconductor integrated circuit is in an ordinary use state after assembled into the system, an approach is employed such that the same voltages are delivered to the test drive voltage supply lines for delivering drive voltages to the test ECL input buffers and the test ECL output buffers, respectively. It is a matter of course that, also when such an approach is employed, effects and/or advantages similar to those of the above-described embodiments can be provided.

What is claimed is:

1. A semiconductor integrated circuit comprising:
a plurality of first Emitter Coupled Logic (ECL) input buffers driven by a specific number of plural first power supplies, for inputting a signal of the ECL level from the external;
a plurality of first ECL output buffers driven by said specific number of second power supplies, for outputting a signal of said ECL level to the external when said semiconductor integrated circuit is assembled;
a plurality of second test ECL input buffers driven by said specific number of first power supplies, for inputting a test signal of said ECL level from the external when the said semiconductor integrated circuit is assembled;
a plurality of second test ECL output buffers driven by said specific number of second power supplies, for outputting a test signal of said ECL level to the external when the said semiconductor integrated circuit is assembled;
said specific number of first drive voltage supply lines for connecting said first power supplies and said first input buffers in order to deliver voltages for driving said first input buffers in an ordinary use state after said semiconductor integrated circuit is assembled;
said specific number of second drive voltage supply lines for connecting said second power supplies and said first output buffers in order to deliver voltages for driving said first output buffers in an ordinary use state after said semiconductor integrated circuit is assembled;
third drive voltage supply lines delivering normal power supply voltages to said second input buffers by said specific number of third power supplies only when said semiconductor integrated circuit is assembled, no drive voltage being delivered in an ordinary use state after said semiconductor integrated circuit is assembled; and
fourth drive voltage supply lines delivering normal power supply voltages to said second output buffers by said specific number of fourth power supplies only when said semiconductor integrated circuit is assembled, no drive voltage being delivered in an ordinary use state after said semiconductor integrated circuit in assembled;
wherein at least any one of said specific number of said third or fourth drive voltage supply lines is common to a corresponding any one of said specific number of first or second drive voltage supply lines.

2. A semiconductor integrated circuit as set forth in claim 1, wherein the number of said third drive voltage supply lines is the same as said specific number of said third power supplies, and that one of said specific number of third supply lines is common to a corresponding one of said specific number of first drive voltage supply lines.

3. A semiconductor integrated circuit as set forth in claim 1, wherein the number of said fourth drive voltage supply lines is the same as said specific number of said fourth power supplies, and that one of said specific number of fourth supply lines is common to a corresponding one of said specific number of second drive voltage supply lines.

4. A semiconductor integrated circuit as set forth in claim 1, wherein said third drive voltage supply lines are separately formed on a Large Scale Integrated circuit (LSI) independently of said first drive voltage supply lines.

5. A semiconductor integrated circuit as set forth in claim 1, wherein said fourth drive voltage supply lines are separately formed on a Large Scale Integrated circuit (LSI) independently of said second drive voltage supply lines.

6. A semiconductor integrated circuit as set forth in claim 1, wherein said plurality of first power supplies for driving said first and second input buffers are comprised of two power supplies, and wherein said plurality of second power supplies for driving said first and second output buffers are also comprised of two power supplies.

7. A semiconductor integrated circuit as set forth in claim 1, wherein said first and second input buffers and said first and second output buffers are comprised of n (n is equal to 2 or more) number of input and output buffer circuits, respectively.

8. A semiconductor integrated circuit as set forth in claim 7, wherein one of said input buffer circuits performs a logical operation of a signal of said ECL level inputted thereto thus to output a signal of the CMOS level, and wherein one of said output buffer circuits performs a logical operation of a signal of said CMOS level inputted thereto to output a signal of the ECL level.

* * * * *